United States Patent
Kuroki

(10) Patent No.: US 7,317,344 B2
(45) Date of Patent: Jan. 8, 2008

(54) FUNCTION SELECTION CIRCUIT USING A FUSE OPTION SCHEME

(75) Inventor: Koji Kuroki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 116 days.

(21) Appl. No.: 10/973,724

(22) Filed: Oct. 25, 2004

(65) Prior Publication Data

US 2005/0194988 A1    Sep. 8, 2005

(30) Foreign Application Priority Data

Mar. 5, 2004    (JP) .............................. 2004-062029

(51) Int. Cl.
H01H 85/00    (2006.01)
H01H 37/76    (2006.01)

(52) U.S. Cl. .................................... 327/525
(58) Field of Classification Search ................ 327/112, 327/225, 526, 525; 365/225.7
See application file for complete search history.

(56) References Cited

U.S. PATENT DOCUMENTS

| | | | | |
|---|---|---|---|---|
| 4,593,203 A | * | 6/1986 | Iwahashi et al. ............. | 327/525 |
| 5,212,413 A | * | 5/1993 | Phelan et al. ................ | 327/537 |
| 5,387,823 A | * | 2/1995 | Ashizawa .................... | 326/13 |
| 5,548,225 A | * | 8/1996 | Rountree et al. ............. | 326/13 |
| 5,723,994 A | * | 3/1998 | Ting et al. ................... | 327/174 |
| 5,821,783 A | * | 10/1998 | Torimaru et al. ........... | 327/108 |
| 6,285,215 B1 | * | 9/2001 | Voshell ........................ | 326/86 |
| 6,377,111 B1 | * | 4/2002 | Moreaux ...................... | 327/525 |
| 6,919,754 B2 | * | 7/2005 | Kuroki ......................... | 327/525 |
| 2002/0079949 A1 | * | 6/2002 | Moreaux ...................... | 327/525 |
| 2004/0046601 A1 | * | 3/2004 | Jung et al. ................... | 327/525 |
| 2005/0146373 A1 | * | 7/2005 | Yoon ............................ | 327/525 |
| 2005/0231264 A1 | * | 10/2005 | Yoon ............................ | 327/526 |
| 2006/0012418 A1 | * | 1/2006 | Shih et al. ................... | 327/525 |

FOREIGN PATENT DOCUMENTS

JP    10-199288    7/1998

* cited by examiner

Primary Examiner—Quan Tra
(74) Attorney, Agent, or Firm—J.C. Patents

(57) ABSTRACT

A semiconductor device is provided as a fuse option circuit. The semiconductor device is configured to include an input, a function selection fuse portion and a reset control circuit portion both connected to the input, and an output connected to the function selection fuse portion. The function is switched by cutting off a first fuse included in the function selection fuse portion. In addition, by cutting off a second fuse included in the reset control circuit portion, the function of the fuse option circuit can be retrieved to the function that the first fuse is not cut off. Therefore, the productivity is the same as a bonding fuse method, and the chip area can be smaller than the chip area obtained by using the bonding option scheme.

11 Claims, 5 Drawing Sheets

FUNCTION SELECTION CIRCUIT USING A FUSE OPTION SCHEME

CROSS-REFERENCE TO RELATED APPLICATION

This application claims the priority benefit of Japanese application serial no. 2004-062029, filed on Mar. 5, 2004.

BACKGROUND OF THE INVENTION

1. Field of the Invention

This invention relates in general to a semiconductor device. More specifically, the present invention relates to function selection circuit by way of fuse option manner.

2. Description of Related Art

A memory, as a semiconductor device, comprises different bit configuration on the same chip, such as ×4 bit, ×8 bit, ×16 bit, etc. The semiconductor device generally further comprises configurations corresponding to a plurality of different external power source voltages, such as 5V, 3.3V, 1.8V, etc. Conventionally, switching of the configurations is implemented by altering wiring patterns at wiring layers. However, when switching the configuration is performed by altering wiring patterns, the productivity of the semiconductor device is decreased since the wiring patterns have to be altered during the wafer manufacturing process.

In order to increase the productivity, a bonding option scheme and a fuse option scheme are used. The bonding option scheme performs the switching of the function configurations by applying the power source voltage or the ground voltage to a particular bonding pad. In addition, the fuse option scheme performs the switching of the function configurations by cutting particular fuses. Japanese Patent No. 2943784 discloses the aforementioned methods.

In particular, the bonding option scheme can carry out a product selection at a chip assembling process subsequent to the wafer manufacturing process. Therefore, the productivity is increased in comparison with the method in which the wiring patterns are altered during the wafer manufacturing process.

However, when the bonding option scheme is used, a plurality of bonding pads for switching the bit configurations is required. A reduction in the area of the semiconductor chip is achieved due to the size reduction, but the size of the bonding pads formed in the semiconductor chip is determined by the restriction of the assembly device, etc., the size of the bonding pads cannot be reduced. Therefore, if the bonding option scheme is used, there might be a problem that the entire area of the semiconductor chip will increase due to the area occupied by the bonding pads.

On the other hand, the fuse option scheme can suppress an increase in the chip area, which is an issue for the boding option scheme. However, in contrast to that the bonding fuse scheme can perform the production selection at the assembling process, the fuse option scheme has to perform the production selection at a probing process that is implemented before the assembling process. For the fuse option scheme, in most cases, the chip cannot be changed to other functions once the fuse is cut off. Therefore, for the fuse option scheme, if compared with the method that the wiring patterns are changed at the wafer manufacturing process, the productivity is increased since the production selection is performed at the probing process subsequent to the wafer manufacturing process. However, the productivity is worse in comparison with the bonding fuse scheme where the production selection is performed at the assembling process subsequent to the probing process.

SUMMARY OF THE INVENTION

According to the foregoing description, an object of this invention is to provide a semiconductor device having a function selection circuit where the fuse option scheme is used. Accordingly, the productivity is the same as bonding fuse method, and the chip area can be smaller than the chip area obtained by using the bonding option scheme.

According to the object mentioned above, the present invention provides a fuse option circuit, which is a semiconductor device. The fuse option circuit comprises an input, a function selection fuse portion connected to the input, a reset control circuit portion connected to the input and an output connected to the function selection fuse portion. The function selection fuse portion further comprises a first P channel type MOS transistor, a first N channel type MOS transistor, a second N channel type MOS transistor, a first fuse and a voltage adjustment circuit.

In the above fuse option circuit, the input is connected to gates of the first P channel type MOS transistor and the first N channel type MOS transistor. A drain of the first P channel type MOS transistor is connected to a drain of the first N channel type MOS transistor through the first fuse and a drain of the second N channel type MOS transistor.

A source of the first P channel type MOS transistor is connected to a power source terminal, sources of the first and the second N channel type MOS transistors are connected to a ground terminal, and the drain of the first P channel type MOS transistor is connected to the output through the voltage adjustment circuit.

The input is further connected to a gate of the second N channel type MOS transistor through the reset control circuit portion.

In one embodiment of the fuse option circuit according to the present invention, the voltage adjustment circuit can further comprise a second P channel type MOS transistor, a first invert amplifier and a second invert amplifier. A source of the second P channel type MOS transistor is connected to the power source terminal, a drain of the second P channel type MOS transistor is connected to the drain of the first P channel type MOS transistor and a gate of the second P channel type MOS transistor through the first invert amplifier. The gate of the second P channel type MOS transistor is further connected to the output through the second invert amplifier.

In addition, the reset control circuit portion can further comprise a third P channel type MOS transistor, a fourth P channel type MOS transistor, a third N channel type MOS transistor, a second fuse, a third invert amplifier, a fourth invert amplifier, a delay circuit and a NOR logic circuit.

In the above reset control circuit portion, the input is connected to gates of the third P channel type and the third N channel type transistors and the delay circuit. Drains of the third P channel type and the third N channel type transistors are connected together through the second fuse. Sources of the third and the fourth P cannel type MOS transistors are connected to the power source terminal. A source of the third N channel type transistor is connected to the ground terminal.

A drain of the fourth P channel type MOS transistor is connected to the drain of the third P channel type MOS transistor. The drain of the fourth P channel type MOS transistor is further connected to a gate of the fourth P channel type MOS transistor through the third invert amplifier. The gate of the fourth P channel type MOS transistor is further connected to one input terminal of the NOR logic circuit, and the delay circuit is connected to another input terminal of the NOR logic circuit through the fourth invert amplifier. An output terminal of the NOR logic circuit is connected to the gate of the second N channel type MOS transistor.

In one embodiment of the fuse option circuit according to the present invention, the fuse option circuit can further comprises a test mode circuit portion for outputting a test signal of an operation potential or a ground potential, a test-based NOR logic circuit connected to the function selection fuse circuit portion and the test mode circuit portion and a fifth invert amplifier connected to an output terminal of the test-based NOR logic circuit.

According to the semiconductor device of the present invention, since the fuse option circuit comprises the reset control circuit portion, a state that the fuse in the function selection fuse circuit portion has not been cut off can be retrieved after the fuse of the function selection fuse circuit portion is cut off.

According to the semiconductor device of the present invention, since the function selection fuse circuit portion comprises the voltage adjustment circuit, a stable voltage can be output even though the fuse is cut off.

since the reset control circuit portion is configured to include a fuse, the reset control circuit portion can be implemented by the same circuit configuration as the function selection fuse circuit portion.

Furthermore, according to the semiconductor device of the present invention, the test mode circuit is further included in the fuse option circuit, so that a state after the fuse is cut off can be simulated to carry out a test before the fuse of the function selection fuse circuit portion is cut off.

BRIEF DESCRIPTION OF THE DRAWINGS

While the specification concludes with claims particularly pointing out and distinctly claiming the subject matter which is regarded as the invention, the objects and features of the invention and further objects, features and advantages thereof will be better understood from the following description taken in connection with the accompanying drawings.

DESCRIPTION OF THE PREFERRED EMBODIMENT

Embodiments of the present invention are described below with reference to drawings. The structure and the arrangement relation are schematically shown only for understanding the present invention easily. In addition, the description is made with reference to the preferred embodiments of the present invention, but those embodiments are only preferred examples and the present invention is not restricted to those embodiment.

First Embodiment

Figure 1:
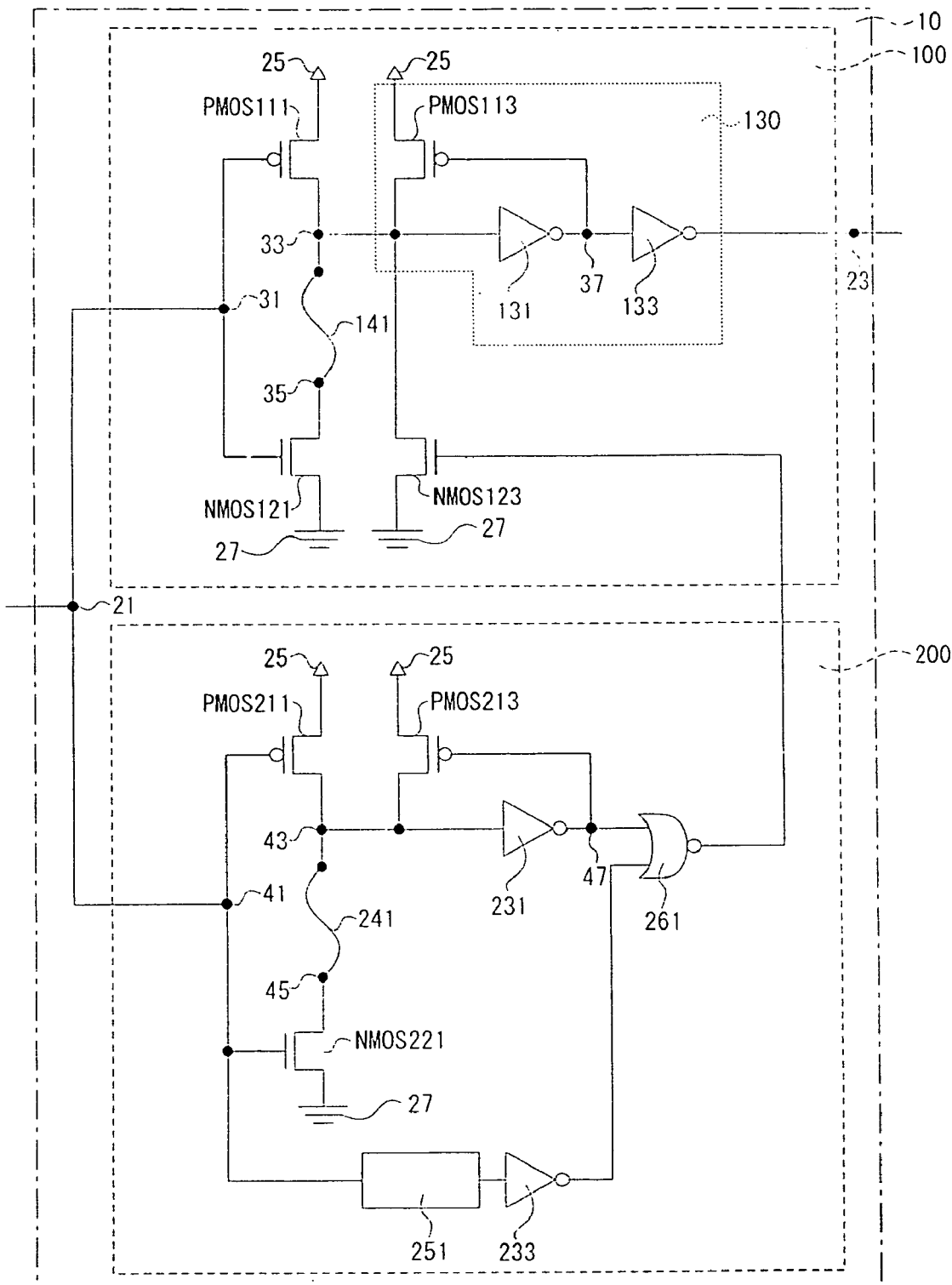
FIG. 1 is a diagram for explaining a fuse option circuit according to the (not a) first embodiment of the present invention.

FIG. 1 is a circuit diagram for explaining a fuse option circuit according to the semiconductor device of the present invention. The fuse option circuit 10 comprises a function selection fuse circuit portion 100 and a reset control circuit portion 200. An input 21 of the fuse option circuit 10 is connected to a first node 31 of the function selection fuse circuit portion 100 and a fifth node 41 of the reset control circuit portion 200.

The function selection fuse circuit portion 100 comprises a first P-channel type MOS transistor 111, a first N-channel type MOS transistor 121, a second N-channel type MOS transistor 123, a voltage adjustment circuit 130 and a first fuse 141. The voltage adjustment circuit 130 further comprises a second P-channel type MOS transistor 113, a first invert amplifier 131 and a second invert amplifier 133. Furthermore, in the following description, PMOS and NMOS are respectively short for the P-channel type and the N-channel type MOS transistors.

The reset control circuit portion 200 comprises a third PMOS 211, a fourth PMOS 213, a third NMOS 221, a third invert amplifier 231, a fourth invert amplifier 266, a second fuse 241 a delay circuit 251 and a NOR logic circuit 261.

The structure of the function selection fuse circuit portion 100 is described as follows. The first node 31 is connected to the gate of the first PMOS 111 and the gate of the first NMOS 121. The source of the first PMOS 111 is connected to a power source terminal 25, and the drain of the first PMOS 111 is connected to a second node 33. Furthermore, the source of the first NMOS 121 is connected to a ground terminal 27, and the drain of the first NMOS 121 is connected to a third node 35. A first fuse 141 is inserted between the second node 33 and the third node 35.

The source, the drain and the gate of the second PMOS 113 are respectively connected to the power source terminal 25, the second node 33 and a fourth node 37. The source of the second NMOS 123 is connected to the ground terminal 27. Additionally, the gate of the second NMOS 123 is connected to an output terminal 261 of the NOR logic circuit 261 included in the reset control circuit portion 200.

An input terminal of the first invert amplifier 131 is connected to the second node 33, and an output terminal of the first invert terminal 131 is connected to the fourth node 37. An input terminal of the second invert amplifier 133 is connected to the fourth node 37, and an output terminal of the second invert terminal 133 is connected to an output of the fuse option circuit 10.

Next, the structure of the reset control circuit portion 200 is described as follows. A fifth node 41 is connected to the gate of the third PMOS 211, the gate of the third NMOS 221, and an input terminal of the delay circuit 251. The source of the third PMOS 211 is connected to the power source terminal 25, and the drain of the third PMOS 211 is connected to a sixth node 43. In addition, the source of the third NMOS 221 is connected to ground terminal 27, and the drain of the third NMOS 221 is connected to a seventh node 45. A second fuse 241 is inserted between the sixth node 43 and the seventh node 45.

The source, the drain and the gate of the fourth PMOS 213 are respectively connected to the power source terminal 25, the sixth node 43 and a eighth node 47.

An input terminal of the third invert amplifier 231 is connected to the sixth node 43, and an output terminal of the third invert amplifier 231 is connected to the eighth node 447. An input of the fourth invert amplifier 233 is connected to an output terminal of the delay circuit 251. The eighth node 47 and the output terminal of the fourth invert amplifier 233 is connected to an input terminal of the NOR logic circuit 261. The eighth node 47 is further connected to another input terminal of the NOR logic circuit 261.

Operation of Initial State in the First Embodiment

The initial state is described as a state that the first fuse 141 is not cut off and the second fuse is also not cut off.

A potential level of the input 21 is set at the ground potential, i.e., 0V before the power source of the fuse option circuit 10 is applied.

By applying the power source to the fuse option circuit 10, the potential of the power source terminal 25 becomes an operation potential Vdd, for example, 12V. In the following description, a potential level equal to the ground potential is referred to a low (Lo) level, and a potential level equal to the operation potential Vdd is referred to a High (Hi) level.

First, the operation of the reset control circuit portion 200 is described as follows.

When the power source is applied to the fuse option circuit 10, the potentials of fifth node 41 and the gates of the third PMOS 211 and the third NMOS 221 are at the Lo level because the potential level of the input 21 is at the Lo level. Therefore, the third PMOS 211 is turned on and the third NMOS 221 is turned off. As a result, the sixth node 43 connected to the drain of the third PMOS 211 and the seventh node 45 connected to the sixth node 43 through the second fuse 241 are at the same potential as the source of the third PMOS 211, i.e., at the Hi level.

When the potential of the sixth node 43 is at the Hi level, the potentials of the eighth node 47 and the gate of the fourth PMOS 213 are inverted by the third invert amplifier 231 and thus become the Lo level. Therefore, the fourth PMOS 213 is turned on, and the potential of the sixth node 43 is kept at the Hi level.

When the potential of the fifth node 41 is at the Lo level, the potentials of the input and the output terminals of the delay circuit 251 and the input terminal of the fourth invert amplifier 233 are at the Lo level. At this time, the potential level of the output terminal of the fourth invert amplifier 233 is inverted by the fourth invert amplifier 233 and thus becomes the Hi level.

Since both the potentials of the eighth node 47 and the output terminal of the fourth invert amplifier 233 are connected to the input terminal of the NOR logic circuit 261, the potential of the input terminal of the NOR logic circuit becomes the Lo level.

The condition that the potential level of the input 21 is transient from the Lo level to the Hi level due to the input signal is described. Since both the gate potentials of the third PMOS 211 and the third NMOS 221 become Hi level due to the transient, the third PMOS 211 is turned off and the third NMOS 221 is turned on. The sixth node 43 and the seventh node 45 is thus connected to the ground terminal 27 through the on state third NMOS 221. Therefore, both the potentials of the sixth node 43 and the seventh node 45 become the Lo level.

When the potential of the sixth node 43 is at the Lo level, the potential of the eighth node 47, i.e., the gate of the fourth PMOS 213 is inverted by the third invert amplifier 231, and becomes the Hi level. Therefore, the fourth PMOS 213 is turned off and the potential of the sixth node 43 becomes the Lo level.

When the fifth node 41 is at the Hi level, the potential of the input and the output terminals of the delay circuit 251 and the potential of the input terminal of the fourth invert amplifier 233 are inverted by the fourth invert amplifier 233 and becomes the Lo level.

The eighth node 47 connected to the input terminal of the NOR logic circuit 261 becomes the Hi level, and the potential of the fourth invert amplifier 233 becomes the Lo level. Therefore, the potential of the output terminal of the NOR logic circuit 261 becomes the Lo level.

As described above, when the second fuse 241 is not cut off, even though the potential of the input 21 is at the Lo or the Hi level, the potential of the output terminal of the NOR logic circuit 261 is at the Lo level.

Next, the operation of the function selection fuse circuit portion 100 is described as follows.

When the power source is applied to the fuse option circuit 10, the gate potentials of the first PMOS 111 and the first NMOS 121 are at the Lo level because the potential level of the input 21 is the Lo level. Therefore, the first PMOS 111 is turned on and the first NMOS 121 is turned off. As a result, the potential of the second node 33 connected to the drain of the first PMOS 111 and the potential of the third node 35 connected to the second node 33 through the first fuse 141 are at the same potential as the source of the first PMOS 111, i.e., the Hi level.

As described above, since the second fuse 241 is not cut off, the potential of the output terminal of the NOR logic circuit 261 is at the Lo level independent of the potential of the input 21. Since the output terminal of the NOR logic circuit 261 is connected to the gate of the second NMOS 123, the second NMOS 123 is turned off independent of the potential of the input 21.

When the potential of the second node 33 is at the Hi level, the potentials of the fourth node 37 and the gate of the second PMOS 113 are inverted by the first invert amplifier 131 and becomes the Lo level. Therefore, the second PMOS 113 is turned on and the potential of the second node 33 is kept at the Hi level.

Since the input terminal of the second invert amplifier 133 is connected to the fourth node 37, the potential of the input terminal of the second invert amplifier 133 is at the Lo level. The potential of the output terminal of the second invert amplifier 133 is inverted to become the Hi level, and then output from the output 23 connected to output terminal of the second invert amplifier 133.

The condition that the potential level of the input 21 is transient from the Lo level to the Hi level due to the input signal is described. Since both the gate potentials of the first PMOS 111 and the first NMOS 121 become the Hi level due to the transient, the first PMOS 111 is turned off and the first NMOS 121 is turned on. The second node 33 and the third node 35 are thus connected to the ground terminal 27 through the on-state first NMOS 121. Therefore, both the potentials of the second node 33 and the third node 35 become the Lo level.

At this time, the potentials of the fourth node 37 and the gate of the second PMOS 113 are inverted by the first invert amplifier 131 and then become the Hi level. Therefore, the second PMOS 113 is turned off and the potential of the second node 33 becomes the Lo level.

Since the input terminal of the second invert amplifier 133 is connected to the fourth node 37, the potential of the input terminal of the second invert amplifier 133 is at the Hi level.

The potential of the output terminal of the second invert amplifier 133 is inverted to become the Lo level, and then output from the output 23 connected to the output terminal of the second invert amplifier 133.

In the case as described above that both the first fuse 141 and the second fuse 241 are not cut off, if a Lo-level signal is input to the input 21, a Hi-level is output from the output 23. Alternatively, if a Hi-level signal is input to the input 21, a Lo-level is output from the output 23.

Operation After Function Switch in the First Embodiment

Figure 2:
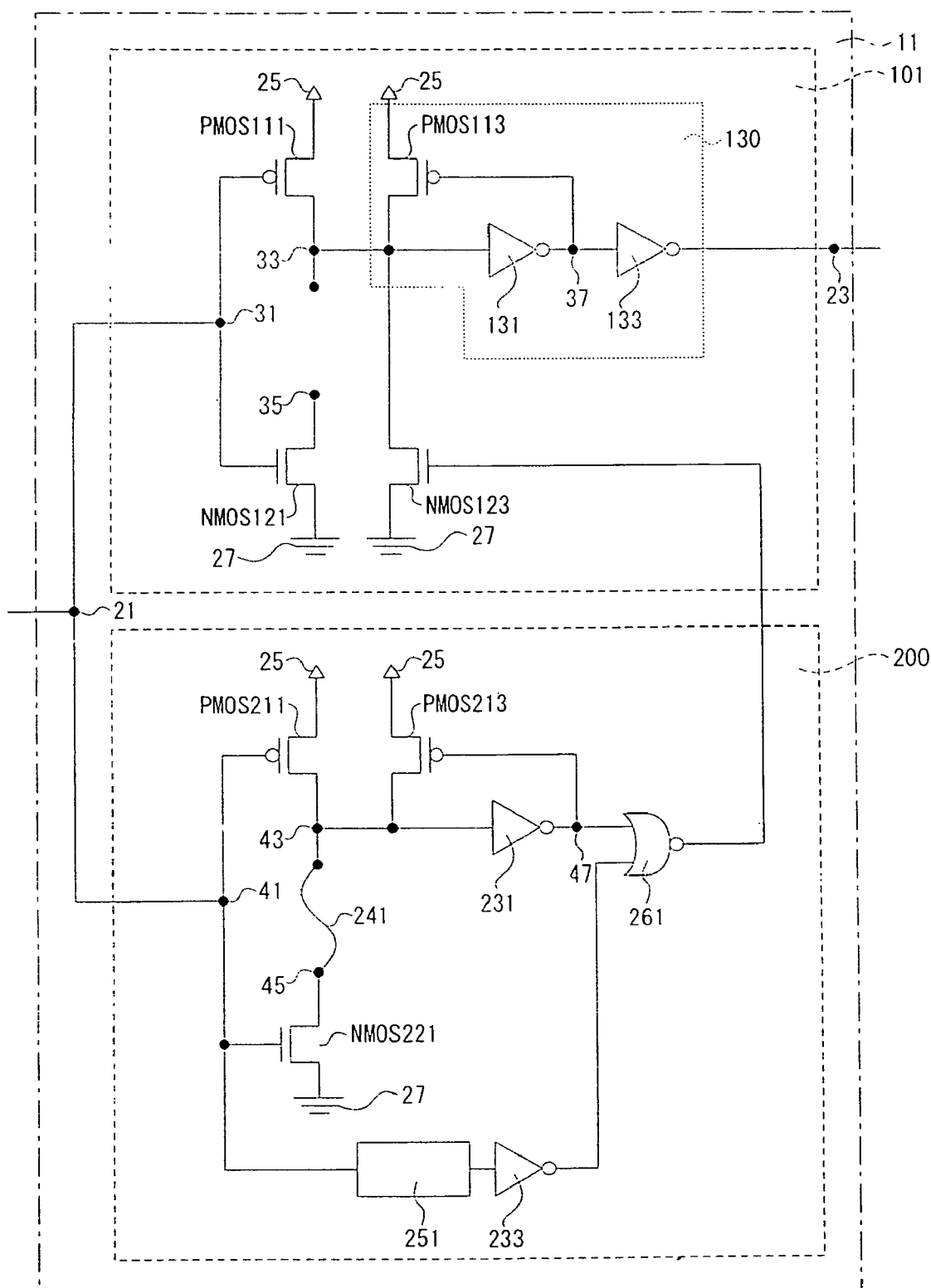
FIG. 2 is a diagram for explaining the circuit where a first fuse of a function fuse circuit portion is cut off according to the fuse option circuit of the first embodiment.

Referring to FIG. 2, a state that the first fuse 141 (in FIG. 1) of function selection fuse circuit portion 101 is cut off for switching the function of the fuse option circuit is described as follows. The fuse option circuit 11 in FIG. 2 is only different from the fuse option circuit 10 in FIG. 1 in that the first fuse 141 (not shown in FIG. 2) included in function selection fuse circuit portion 101 is cut off.

Since the second fuse 241 is not cut off, the operation of the reset control circuit portion 200 is same as the operation at the initial state of the aforementioned first embodiment. Namely, even though the potential level of the input 21 is at the Lo level or the Hi level, the potential of the output terminal of the NOR logic circuit 261 is at the Lo level. Therefore, the second NMOS 123 whose gate is connected to the output terminal of the NOR logic circuit is the off state independent of the potential of the input 21.

The function selection fuse circuit portion 101 of the fuse option circuit 11 is described as follows. When the power source is applied to the fuse option circuit 11, the gate potentials of the first PMOS 111 and the first NMOS 121 are at the Lo level since the potential level of the input 21 is at the Lo level. Therefore, the first PMOS 111 is turned on and the first NMOS 121 is turned off. As a result, the second node 33 connected to the drain of the first PMOS 111 is at the same potential as the source of the first PMOS 111, i.e., the Hi level. In addition, the potential of the third node 35 is at the Lo level since the first fuse 141 is cut off.

When the potential of the second node 33 is at the Hi level, the potential the fourth node 37, i.e., the gate of the second PMOS 113 is inverted by the first invert amplifier 131, and then becomes the Lo level. Therefore, the second PMOS 113 is turned on, and the potential of the second node 33 is kept at the Hi level.

Since the input terminal of the second invert amplifier 133 is connected to the fourth node 37, the input terminal of the second invert amplifier 133 is at the Lo level. The potential of the output terminal of the second invert amplifier 133 is inverted to become the Hi level, and then output from the output 23 connected to the output terminal of the second invert amplifier 133.

The condition that the potential level of the input 21 is transient from the Lo level to the Hi level due to the input signal is described. Since both the gate potentials of the first PMOS 111 and the first NMOS 121 become the Hi level due to the transient, the first PMOS 111 is turned off and the first NMOS 121 is turned on. The second node 33 and the third node 35 are thus connected to the ground terminal 27 through the on-state first NMOS 121. Therefore, both the potentials of the second node 33 and the third node 35 become the Lo level. On the other hand, since the first fuse 141 is cut off and the second NMOS 123 is turned off, the potential of the second node 33 is at the Hi level.

When the potential of the second node 33 is at the Hi level, the potentials of the fourth node 37 and the gate of the second PMOS 113 are inverted by the first invert amplifier 131, and then become the Lo level. Therefore, the second PMOS 113 is turned on, and the potential of the second node 33 is kept at the Hi level.

Since the input terminal of the second invert amplifier 133 is connected to the fourth node 37, the potential of the input terminal of the second invert amplifier 133 is at the Lo level. The potential of the output terminal of the second invert amplifier 133 is inverted to become the Hi level, and then output from the output 23 connected to the output terminal of the second invert amplifier 133.

When the first fuse 141 is cut off and the second NMOS 123 is turned off, if the first PMOS 111 is turned on and the second node 33 becomes the Hi level, the voltage adjustment circuit 130 formed by the first invert amplifier 131 and the second invert amplifier 133 becomes a latch circuit. At this time, even though the first PMOS 111 is turned off, the potentials of the second node 33 and the output 23 are kept at the Hi level.

As described above, when the first fuse of the function selection fuse circuit portion 101 is cut off, the fuse option circuit 11 outputs the Hi-level signal from the output 23 regardless whether the input signal input to the input 21 is at the Lo level or the Hi level.

Operation After Function Reset in the First Embodiment

Figure 3:
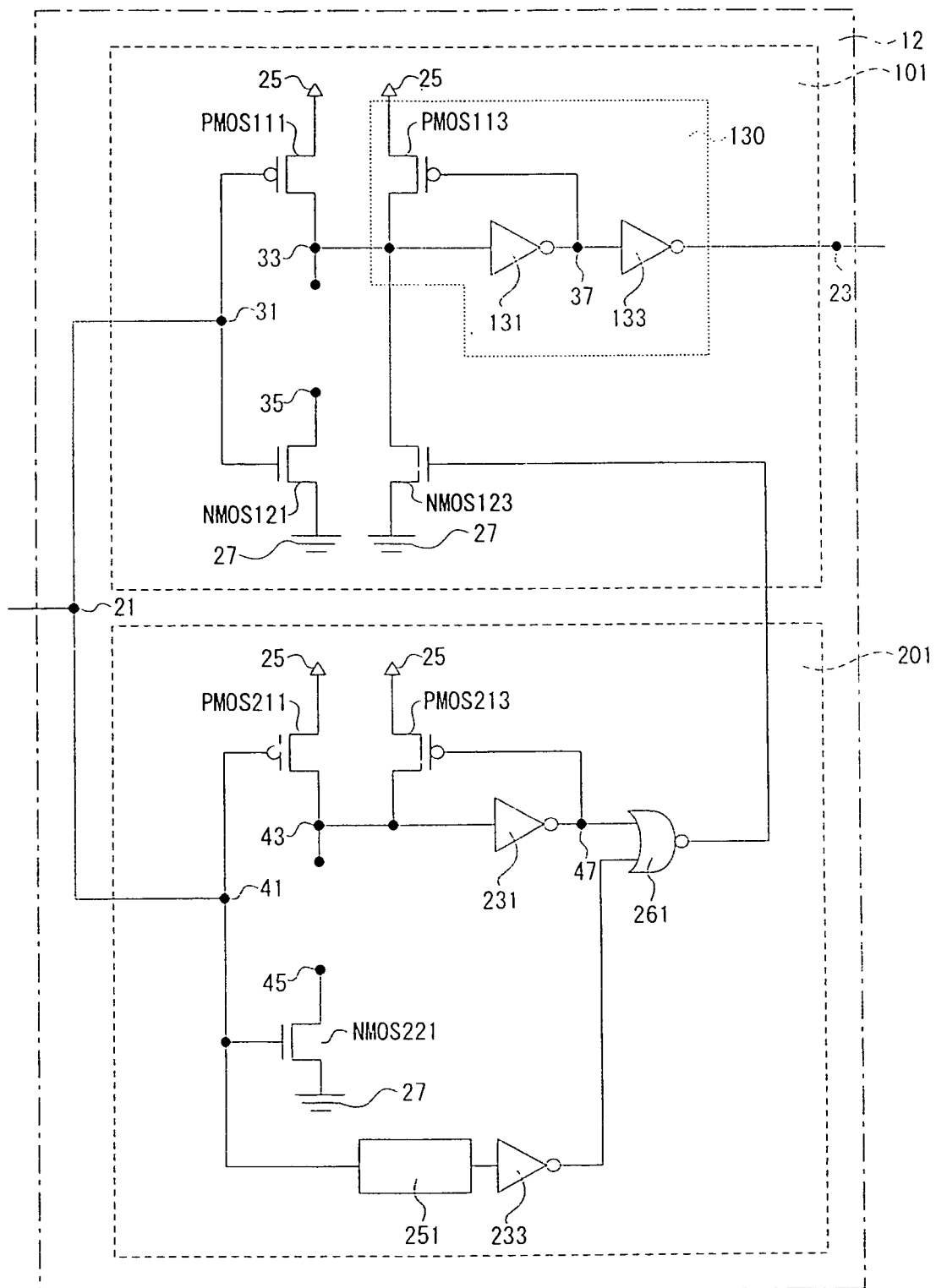
FIG. 3 is a diagram for explaining the circuit where a first fuse of a function fuse circuit portion is cut off and a second fuse of a reset control circuit portion is further cut off according to the fuse option circuit of the first embodiment.

Referring to FIG. 3, a state that the second fuse (241 in FIG. 2) included in reset control circuit portion 201 is cut off for returning the state before the first fuse is cut off is described as follows. The fuse option circuit 12 in FIG. 3 is only different from the fuse option circuit 11 in FIG. 2 in that the second fuse 241 included in reset control circuit portion 201 is cut off.

Next, the operation of the reset control circuit portion 201 is described as follows.

The potential of the fifth node 41 and the gate potentials of the third PMOS 211 and the third NMOS 221 are at the Lo level since the potential of the input 21 is at the Lo level. Consequently, the third PMOS 211 is turned on and the third NMOS 221 is turned off. At this time, since the second fuse 241 is cut off, the seventh node 45 is at the ground potential, i.e., the Lo level with respect to that the sixth node 43 becomes the Hi level.

When the potential of the sixth node 43 is at the Hi level, the potentials of the eighth node 47 and the gate of the fourth PMOS 213 are inverted by the third invert amplifier to become the Lo level. Therefore, the fourth PMOS 213 is turned on, and the potential of the sixth node 43 is kept at the Hi level.

When the fifth node 41 is at the Lo level, the potentials of the input and the output terminals of the delay circuit 251 and the potential of the input terminal of the fourth invert amplifier 233 are at the Lo level. At this time, the potential of the output terminal of the fourth invert amplifier 233 is inverted by the fourth invert amplifier 233, and then becomes the Hi level.

The potential of the output terminal of the NOR logic circuit 261 becomes the Lo level since the Lo-level eighth node 47 and the Hi-level output terminal of the fourth invert amplifier 233 are connected to the input terminals of the NOR logic circuit 261.

The condition that the potential level of the input 21 is transient from the Lo level to the Hi level due to the input signal is described. Since the potential of the fifth node 41 and the gate potentials of the third PMOS 211 and the third NMOS 221 become Hi level due to the transient, the third PMOS 211 is turned off and the third NMOS 221 is turned on. At this time, since the second fuse 241 is cut off, the sixth node 43 is still at the Hi level, and the seventh node 45 is at the ground potential, i.e., the Lo level.

When the potential of the sixth node 43 is at the Hi level, the potential of the eighth node 47, i.e., the gate of the fourth PMOS 213 is inverted by the third invert amplifier 231, and then becomes the Lo level. Therefore, the fourth PMOS 213 is turned on and the potential of the sixth node 43 is kept at the Hi level.

When the fifth node 41 is at the Hi level, the potential of the input and the output terminals of the delay circuit 251 and the potential of the input terminal of the fourth invert amplifier 233 are at the Hi level. At this time, the potential level of the output terminal of the fourth invert amplifier 233 is inverted by the fourth invert amplifier 233, and becomes the Lo level.

The potential of the output terminal of the NOR logic circuit 261 becomes the Hi level since the Lo-level eighth node 47 and the Lo-level output terminal of the fourth invert amplifier 233 are connected to the input terminal of the NOR logic circuit 261.

As described above, the potential of the output terminal of the NOR logic circuit 261 included in the reset control circuit portion 201 is at the Lo level when the potential of the input 21 is at the Lo level, and at the Hi level when the potential of the input 21 is at the Hi level.

Next, the operation of the function selection fuse circuit 101 is described as follows.

Since the potential of the input 21 is at the Lo level, the potential of the first node 31 and the gate potentials of the first PMOS 111 and the first NMOS 121 are at the Lo level. Therefore, the first PMOS 111 is turned on and the first NMOS 121 is turned off. At this time, since the first fuse 141 is cut off and the first NMOS 121 is turned off, the third node 35 is at the ground potential, i.e., the Lo level, relative to that the second node 33 becomes the Hi level.

When the potential of the second node 33 is at the Hi level, the potentials of the fourth node 37 and the gate of the second PMOS 113 are inverted by the first invert amplifier 131 and become the Lo level. Therefore, the second PMOS 113 is turned on and the potential of the second node 33 is kept at the Hi level.

Because the input terminal of the second invert amplifier 133 is connected to the fourth node 37, the potential of the input terminal of the second invert amplifier 133 is at the Lo level. The potential of the output terminal of the second invert amplifier 133 is inverted to become the Hi level, and then output from the output 23 connected to the output terminal of the second invert amplifier 133.

The potential level of the input 21 is transient from the Lo level to the Hi level due to the input signal. Since both the gate potentials of the first PMOS 111 and the first NMOS 121 become the Hi level due to the transient, the first PMOS 111 is turned off and the firs NMOS 121 is turned on. The potential of the third node 35 is at the Lo level because the third node 35 is grounded through the on-state first NMOS 121. On the other hand, since the first fuse 141 is cut off and the second NMOS 123 is turned on, the potential of the second node 33 becomes the Lo level. In addition, by using the delay circuit 251 included in the reset control circuit portion 201, the state of the second NMOS 123 is changed after the first PMOS 11, the first NMOS 121 and the second PMOS 113 change their states between the on state and the off state.

Since the input terminal of the second invert amplifier 133 is connected to the fourth node 37, the input terminal of the second invert amplifier 133 is at the Hi level. The potential of the output terminal of the second invert amplifier 133 is inverted to the Lo level, and then output from the output 23 connected to the output terminal of the second invert amplifier 133.

As described above, when both the first fuse 141 and the second fuse 241 are cut off, a Hi-level signal is output from the output 23 if a Lo-level signal is input on the input 21, and a Lo-level signal is output from the output 23 if a Hi-level signal is input on the input 21. In other words, the operation is the same as the initial state, i.e., both the first fuse 141 and the second fuse 241 are not cut off.

Figure 4:
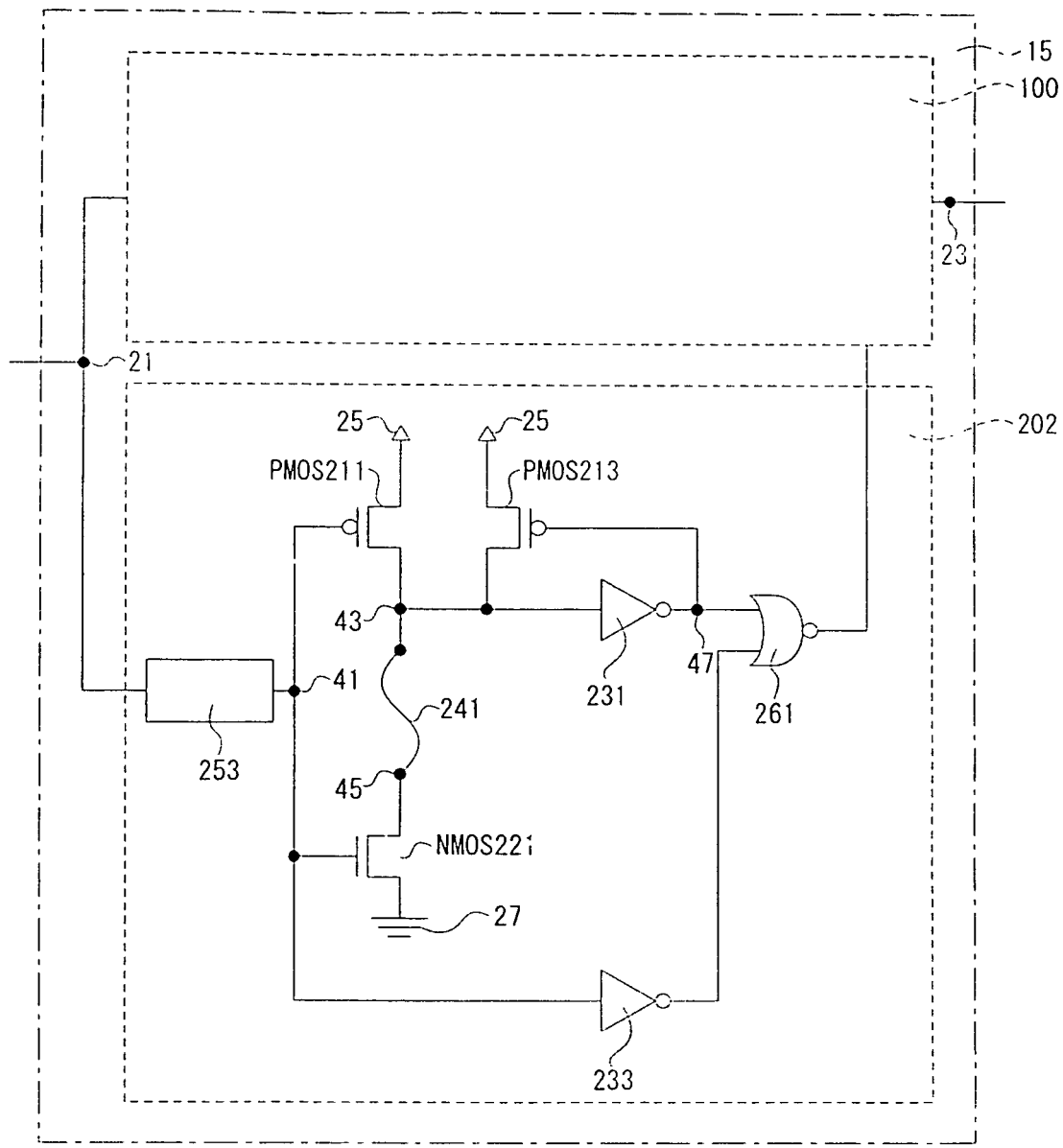
FIG. 4 is a diagram for explaining the reset control circuit portion according to an alternative example of the first embodiment.

In addition, as the fuse option circuit 15 shown in FIG. 4, the delay circuit 253 can be set between the input 21 and the fifth node 41. Furthermore, referring to the fuse option circuit 10 in FIG. 1, since the only difference is the location where the delay circuit is set, the drawing of the function selection fuse circuit portion 100 is omitted. The delay circuit can make the state of the second NMOS 113 change after the states of the first PMOS 11, the first NMOS 121 and the second PMOS 113 are changed. For example, when the transient from the Lo level to the Hi level at the fifth node 41 occurs behind the transient at the first node 31, the delay circuit can be omitted.

As described above, the fuse option circuit of the semiconductor, according to the present invention, comprises the reset control circuit portion. Therefore, after the fuse in the function selection fuse circuit portion is cut off, the state that the fuse is cut off can be retrieved by cutting the fuse included in the reset control circuit portion.

In addition, if possible, capacitors can be used to replace the fuses. When fuses are used, an on state is switched to an isolation state by cutting off the fuses. Alternatively, when capacitors are used, a high voltage is applied to the electrodes of the capacitors to break the capacitors, and thus an isolation state is switched to an on state.

Second Embodiment

Figure 5:
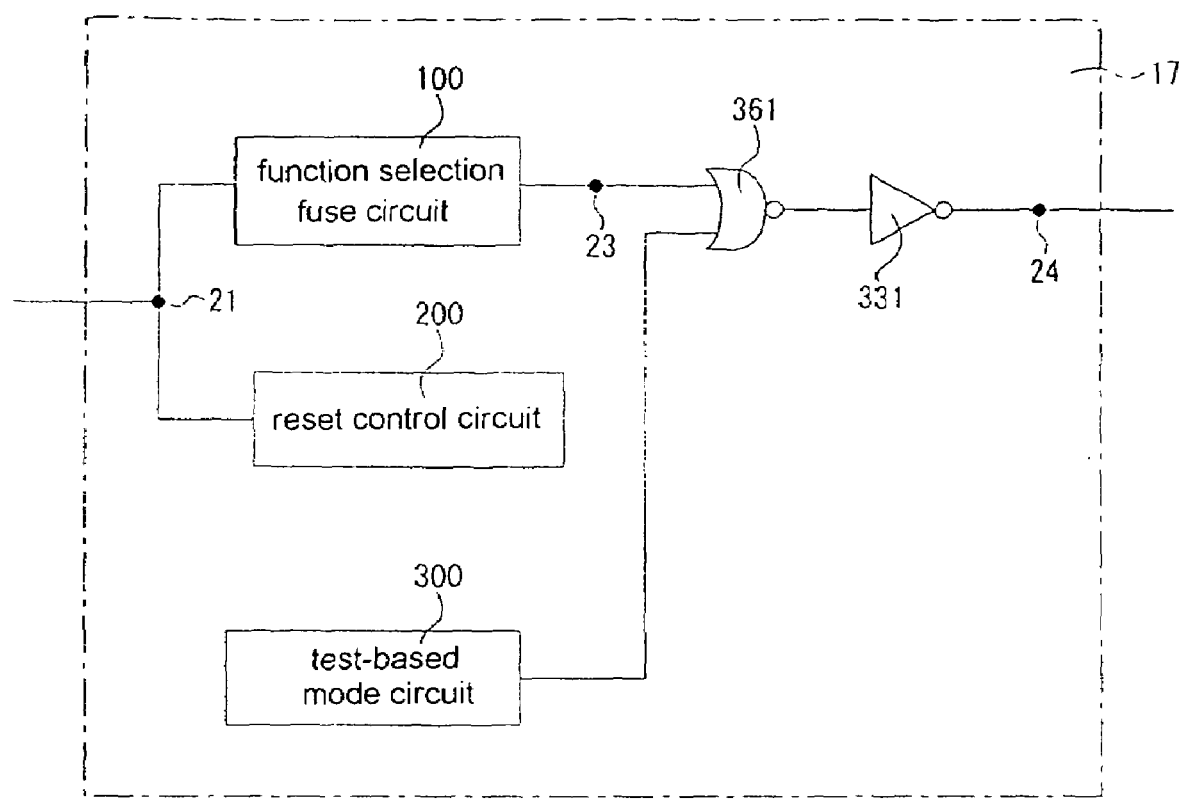
FIG. 5 is a diagram for explaining a fuse option circuit according to the (not a) second embodiment of the present invention.

Referring to FIG. 5, a fuse option circuit according to the second embodiment is described in detail as follows. In the second embodiment, the fuse option circuit 17 further comprises a test mode circuit portion 300, a test-based NOR logic circuit 361 and a fifth invert amplifier 331 in the fuse option circuit 10 of the first embodiment.

The function selection fuse circuit portion 100 and the reset control circuit portion 200 can use the circuits shown in FIG. 1, and their corresponding description is omitted. In addition, the first fuse in the function selection fuse circuit portion 100 and the second fuse in the reset control circuit portion 200 are presumed to be not cut off.

For a normal mode, the test mode circuit portion 300 outputs a ground potential corresponding to a non cut-off state of the fuse, i.e., a Lo-level signal. Alternatively, for a test mode, the test mode circuit portion 300 outputs an operation potential corresponding to a cut-off state of the fuse, i.e., a Hi-level signal.

The output of the function selection fuse circuit portion 100 and the output of the test mode circuit portion 300 are connected to inputs of the test-based NOR logic circuit 361. An output terminal of the test-based NOR logic circuit 361 is connected to an input terminal of the fifth invert amplifier 331, and an output terminal of the fifth invert amplifier 331 is connected to an output 24.

Operation of Normal Mode in the Second Embodiment

In the normal mode, the test mode circuit portion 300 outputs the Lo-level signal.

Since the first fuse of the function selection fuse circuit portion 100 is not cut off, as the operation of the initial state in the first embodiment described above, the function selection fuse circuit portion 100 outputs a Hi-level signal when a signal input to the input 21 is at the Lo level, and outputs a Lo-level signal when a Hi-level signal is input to the input 21.

As the above output signal is input to the test-based NOR logic circuit 361, since the output of the test mode circuit portion 300 is at the Lo level, the output of the test-based NOR logic circuit 361 becomes the Lo level when the Hi-level signal is output from the function selection fuse circuit portion 100, and the output of the test-based NOR logic circuit 361 becomes the Hi level when the Lo-level signal is output from the function selection fuse circuit portion 100. Since the output of the test-based NOR logic circuit 361 is inverted by the fifth invert amplifier 331, the Hi-level signal is output from the test output 24 when the output of the test-based NOR logic circuit 361 is at the Lo level, and the Lo-level signal is output from the test output 24 when the output of the test-based NOR logic circuit 361 is at the Hi level.

Therefore, the output of the test output 24 is consistent with the output that the first fuse of the function selection fuse circuit portion 100 is not cut off.

Operation of Test Mode in the Second Embodiment

In the test mode, the test mode circuit portion 300 outputs a Hi-level signal.

Since the first fuse of the function selection fuse circuit portion 100 is not cut off, as the operation of the initial state in the first embodiment described above, the function selection fuse circuit portion 100 outputs a Hi-level signal when a signal input to the input 21 is at the Lo level, and outputs a Lo-level signal when a Hi-level signal is input to the input 21.

As the above output signal is input to the test-based NOR logic circuit 361, since the output of the test mode circuit portion 300 is at the Hi level, the output of the test-based NOR logic circuit 361 becomes the Lo level when the Hi-level signal is output from the function selection fuse circuit portion 100, and the output of the test-based NOR logic circuit 361 also becomes the Lo level when the Lo-level signal is output from the function selection fuse circuit portion 100. Since the output of the test-based NOR logic circuit 361 is inverted by the fifth invert amplifier 331, the Hi-level signal is output from the test output 24.

Therefore, the output of the test output 24 is consistent with the output that the first fuse of the function selection fuse circuit portion 100 is cut off.

As described above, by including the test mode circuit portion 300, the state that the first fuse has been cut off can be simulated to perform a test before the first fuse of the function selection fuse circuit portion 100 is cut off.

While the present invention has been described with a preferred embodiment, this description is not intended to limit our invention. Various modifications of the embodiment will be apparent to those skilled in the art. It is therefore contemplated that the appended claims will cover any such modifications or embodiments as fall within the true scope of the invention.

What is claimed is:

1. A semiconductor device, comprising:
   an input;
   a function selection fuse portion, connected to the input;
   a rest control circuit portion, connected to the input; and
   an output, connected to the function selection fuse portion,
   wherein the function selection fuse portion further comprises a first P channel type MOS transistor, a first N channel type MOS transistor, a second N channel type MOS transistor, a first fuse and a voltage adjustment circuit,
   wherein the input is connected to gates of the first P channel type MOS transistor and the first N channel type MOS transistor,
   a drain of the first P channel type MOS transistor is connected to a drain of the first N channel type MOS transistor through the first fuse and a drain of the second N channel type MOS transistor,
   wherein a source of the first P channel type MOS transistor is connected to a power source terminal,
   sources of the first and the second N channel type MOS transistors are connected to a ground terminal,
   the drain of the first P channel type MOS transistor is connected to the output through the voltage adjustment circuit,
   the input is further connected to a gate of the second N channel type MOS transistor through the rest control circuit portion,
   wherein the drain of the first P channel type MOS transistor is directly connected to the first fuse.

2. The semiconductor device of claim 1, wherein the voltage adjustment circuit further comprises a second P channel type MOS transistor, a first invert amplifier and a second invert amplifier, and
   wherein a source of the second P channel type MOS transistor is connected to the power source terminal, a drain of the second P channel type MOS transistor is connected to the drain of the first P channel type MOS transistor and connected to a gate of the second P channel type MOS transistor through the first invert amplifier, and
   the gate of the second P channel type MOS transistor is further connected to the output through the second invert amplifier.

3. The semiconductor device of claim 1, wherein the reset control circuit portion further comprises a third P channel type MOS transistor, a fourth P channel type MOS transistor, a third N channel type MOS transistor, a second fuse, a third invert amplifier, a fourth invert amplifier, a delay circuit, and a NOR logic circuit, and
   wherein the input is connected to gates of the third P channel type and the third N channel type transistors and the delay circuit,
   drains of the third P channel type and the third N channel type transistors are connected together through the second fuse,
   sources of the third and the fourth P cannel type MOS transistor is connected to the power source terminal,
   a source of the third N channel type transistor is connected to the ground terminal,
   a drain of the fourth P channel type MOS transistor is connected to the drain of the third P channel type MOS transistor,
   the drain of the fourth P channel type MOS transistor is further connected to a gate of the fourth P channel type MOS transistor through the third invert amplifier,
   the gate of the fourth P channel type MOS transistor is further connected to one input terminal of the NOR logic circuit, the delay circuit is connected to another input terminal of the NOR logic circuit through the fourth invert amplifier, an output terminal of the NOR logic circuit is connected to the gate of the second N channel type MOS transistor.

4. The semiconductor device of claim 2, wherein the reset control circuit portion further comprises a third P channel type MOS transistor, a fourth P channel type MOS transistor, a third N channel type MOS transistor, a second fuse, a third invert amplifier, a fourth invert amplifier, a delay circuit, and a NOR logic circuit, and wherein the input is connected to gates of the third P channel type and the third N channel type transistors and the delay circuit, drains of the third P channel type and the third N channel type transistors are connected together through the second fuse, sources of the third and the fourth P cannel type MOS transistor is connected to the power source terminal, a source of the third N channel type transistor is connected to the ground terminal, a drain of the fourth P channel type MOS transistor is connected to the drain of the third P channel type MOS transistor, the drain of the fourth P channel type MOS transistor is further connected to a gate of the fourth P channel type MOS transistor through the third invert amplifier, the gate of the fourth P channel type MOS transistor is further connected to one input terminal of the NOR logic circuit, the delay circuit is connected to another input terminal of the NOR logic circuit through the fourth invert amplifier, an output terminal of the NOR logic circuit is connected to the gate of the second N channel type MOS transistor.

5. The semiconductor device of claim 1, further comprising:

a test mode circuit portion, for outputting a test signal of an operation potential or a ground potential;

a test-based NOR logic circuit, connected to the function selection fuse circuit portion and the test mode circuit portion; and a fifth invert amplifier, connected to an output terminal of the test-based NOR logic circuit.

6. The semiconductor device of claim 2, further comprising:

a test mode circuit portion, for outputting a test signal of an operation potential or a ground potential;

a test-based NOR logic circuit, connected to the function selection fuse circuit portion and the test mode circuit portion; and a fifth invert amplifier, connected to an output terminal of the test-based NOR logic circuit.

7. The semiconductor device of claim 3, further comprising:

a test mode circuit portion, for outputting a test signal of an operation potential or a ground potential;

a test-based NOR logic circuit, connected to the function selection fuse circuit portion and the test mode circuit portion; and a fifth invert amplifier, connected to an output terminal of the test-based NOR logic circuit.

8. The semiconductor device of claim 4, further comprising:

a test mode circuit portion, for outputting a test signal of an operation potential or a ground potential;

a test-based NOR logic circuit, connected to the function selection fuse circuit portion and the test mode circuit portion; and a fifth invert amplifier, connected to an output terminal of the test-based NOR logic circuit.

9. A semiconductor device, comprising: an input;

a function selection portion, connected to the input;

a rest control circuit portion, connected to the input; and an output, connected to the function fuse portion, wherein the function selection fuse portion further comprises a first P channel type MOS transistor, a first N channel type MOS transistor, a first fuse and a voltage adjustment circuit, wherein the input is connected to a gate of the first P channel type MOS transistor, a drain of the first P channel type MOS transistor is connected to a ground terminal through the first fuse and a drain of the first N channel type MOS transistor, wherein a source of the P channel type MOS transistor is connected to a power source terminal, a source of the first N channel type MOS transistor is connected to the ground terminal, the drain of the first P channel type MOS transistor is connected to the output through the voltage adjustment circuit, the input is further connected to a gate of the first N channel type MOS transistor though the rest control circuit portion, wherein the drain of the first P channel type MOS transistor is directly connected to the first fuse.

10. A semiconductor device, comprising: an input;

a function selection portion, connected to the input; a rest control circuit portion, connected to the input; and an output, connected to the function fuse portion, wherein the function selection fuse portion further comprises a first N channel type MOS transistor, a first P channel type MOS transistor, a second P channel type MOS transistor, a first fuse and a voltage adjustment circuit, wherein the input is connected to gates of the first N channel type MOS transistor and the first P channel type MOS transistor, a drain of the first N channel type MOS transistor is connected to a drain of the first P channel type MOS transistor through the first fuse and a drain of the second P channel type MOS transistor, wherein a source of the first N channel type MOS transistor is connected to a ground terminal, sources of the first and the second P channel type MOS transistors are connected to a power source terminal, the drain of the first N channel type MOS transistor is connected to the output through the voltage adjustment circuit, the input is further connected to a gate of the second P channel type MOS transistor though the rest control circuit portions, wherein the reset control circuit portion further comprises a third P channel type MOS transistor, a fourth P channel type MOS transistor, a third N channel type MOS transistor, a second fuse, a third invert amplifier, a fourth invert amplifier, a delay circuit, and a NOR logic circuit, and wherein the input is connected to gates of the third P channel type and the third N channel type transistors and the delay circuit, drains of the third P channel type and the third N channel type transistors are connected together through the second fuse, sources of the third and the fourth P cannel type MOS transistor is connected to the power source terminal.

a source of the third N channel type transistor is connected to the ground terminal, a drain of the fourth P channel type MOS transistor is connected to the drain of the third P channel type MOS transistor.

the drain of the fourth P channel type MOS transistor is further connected to a gate of the fourth P channel type MOS transistor through the third invert amplifier, the gate of the fourth P channel type MOS transistor is further connected to one input terminal of the NOR logic circuit, the delay circuit is connected to another input terminal of the NOR logic circuit through the fourth invert amplifier, an output terminal of the NOR logic circuit is connected to the gate of the second N channel type MOS transistor.

11. The semiconductor device of claim 10, wherein the drain of the first N channel type MOS transistor is directly connected to the first fuse.

* * * * *